United States Patent [19]

Oppelt et al.

[11] Patent Number: 5,603,324
[45] Date of Patent: Feb. 18, 1997

[54] DUPLEXER INCLUDING A FIELD-EFFECT TRANSISTOR FOR USE IN AN ULTRASOUND IMAGING SYSTEM

[75] Inventors: Ralph Oppelt, Uttenreuth; Markus Vester, Erlangen, both of Germany

[73] Assignee: Siemens Aktiengesellschaft, Munich, Germany

[21] Appl. No.: 426,341

[22] Filed: Apr. 21, 1995

[30] Foreign Application Priority Data

May 19, 1994 [DE] Germany ............................ 44 17 606.6

[51] Int. Cl.⁶ .................................................. A61B 8/00
[52] U.S. Cl. .................................................. 128/660.01
[58] Field of Search ..................... 128/660.01, 660.07, 128/661.01, 661.09; 73/625–626, 632; 367/7, 103, 105

[56] References Cited

U.S. PATENT DOCUMENTS

| | | | |
|---|---|---|---|
| 3,604,250 | 9/1971 | Grandia et al. | 73/67.5 |
| 3,676,839 | 7/1972 | Wohl et al. | 343/115 X |
| 3,919,683 | 11/1975 | Itamura et al. | 340/1 |
| 4,353,004 | 10/1982 | Kleinschmidt | 310/318 |
| 4,357,690 | 11/1982 | Kuroda et al. | 367/8.7 |
| 4,543,829 | 10/1985 | Lerch | 73/626 |
| 4,563,899 | 1/1986 | Nakamura | 73/626 |
| 4,566,331 | 1/1986 | Schroeder | 73/632 |
| 4,671,115 | 6/1987 | Ogawa et al. | 73/626 |
| 4,731,762 | 3/1988 | Hanks | 367/108 |
| 4,805,458 | 2/1989 | Yoshie | 73/602 |
| 4,926,380 | 5/1990 | Harada | 367/7 |
| 4,953,141 | 8/1990 | Novak et al. | 367/108 |
| 5,001,678 | 3/1991 | Fukuoka et al. | 367/105 |
| 5,105,144 | 4/1992 | Trump | 323/283 |
| 5,267,219 | 11/1993 | Woodward | 367/99 |
| 5,271,403 | 12/1993 | Paulos | 128/660 |

FOREIGN PATENT DOCUMENTS

| | | |
|---|---|---|
| 3347442 | 7/1985 | Germany . |
| 3618222 | 12/1987 | Germany . |
| 2114296 | 8/1983 | United Kingdom . |

OTHER PUBLICATIONS

IEEE Transactions on Ultrasonics, Ferroelectrics, and Frequency Control. vol. 35, No. 4, 4 Jul. 1988, Donald O. Thompson et al., pp. 450–456: *Technique for Generation of Unipolar Ultrasonic Pulses.*

Springer Verlag, Tietze/Schenk, 9th ed., p. 217, 1990: *Halbleiter–Schaltungstechnik.*

*Primary Examiner*—Francis Jaworski
*Attorney, Agent, or Firm*—Kenyon & Kenyon

[57] ABSTRACT

A duplexer for an ultrasound imaging system is capable of selectively coupling a transducer element to either a transmitter or a receiver, depending on whether the imaging system is in the transmit mode or receive mode. The duplexer contains a field-effect transistor whose source and drain are connected between the transducer element and the receiver. The gate of the field effect transistor may either be driven with a control voltage or short-circuited to the source. In this manner, one obtains an improved duplexer that operates with virtually no power loss, without drive circuits, without leakage currents, and with low noise.

7 Claims, 2 Drawing Sheets

DUPLEXER INCLUDING A FIELD-EFFECT TRANSISTOR FOR USE IN AN ULTRASOUND IMAGING SYSTEM

BACKGROUND OF THE INVENTION

The invention relates generally to a duplexer for an ultrasound imaging system, and in particular to a duplexer for selectively connecting an ultrasound transducer element to either a transmitter or a receiver. A duplexer of this general type is disclosed, for example, in German publication DE-A-33 01 967.

The present invention is related to an invention described in an application entitled "Duplexer Including a Variable-Capacitance Diode for Use in an Ultrasound Imaging System," filed on Apr. 20, 1995, as U.S. Ser. No. 08/425,631, by the same inventors. The disclosure of the copending application is explicitly incorporated herein by reference.

Ultrasound imaging systems generally operate according to a "pulse-echo method." Such systems are capable of alternately functioning in two basic modes: transmit and receive. In the transmit mode, one or more piezoelectric transducer elements, preferably arranged in a linear or two-dimensional array, are excited to high-frequency oscillation by electrical pulses emitted by a transmitter, thereby generating an ultrasound pulse that may be directed at an object to be imaged. This ultrasound pulse is echoed back towards the transducer from some point within the object; for example, at boundary layers between two media with differing acoustic impedance. Then, in the receive mode, the "echo pulse" is received by the transducer element and converted into a corresponding electrical input signal (i.e., the "echo signal") that is fed to a receiver equipped with sensitive preamplifiers for enhancing the signal. The amplified signal may then be fed to a signal processor for evaluating the echoed image data to generate a visual image.

The transmit pulse and the echo pulse must be separated from one another for the two operating modes of the ultrasound imaging system to operate effectively. To this end, a transmit/receive filter, known as a duplexer, is associated with each transducer element in the ultrasound imaging system. Each duplexer selectively connects a respective transducer element to either the transmitter or the receiver, depending on whether the imaging system is operating in the transmit mode or the receive mode.

Decoupling the transmitter from the receiver is principally desirable because of the differing amplitudes of the transmitted and received signals. For instance, the transmit pulses used to excite the transducer elements have comparably high voltage amplitudes, typically greater than 100 V. On the other hand, the received echo signals are comparatively weak, requiring amplification by sensitive preamplifiers in the receiver. The duplexer must therefore electrically decouple the receiver from the transmitter during the transmit mode to protect the preamplifiers from being damaged by the strong transmit pulses coming from the transmitter. Decoupling from the transmitter is also desirable during the receive mode to prevent noise generated by the transmitter from disrupting the signals input to the receiver. Similarly, decoupling the transmitter from the receiver is desirable during the transmit mode to prevent the receiver from reacting to the transmitter in a manner that might disrupt or distort the shape of the transmit pulse.

In addition to these fundamental operational requirements for a duplexer in an ultrasound imaging system, further conditions must often be met in practice. For example, small transducer elements, such as those typically found in linear or two-dimensional arrays, generally have a high internal impedance. The ohmic and, above all, the capacitive loading caused by the duplexer should therefore be kept as small as possible. Likewise, the internal current consumption of the duplexer should be minimized to limit power loss in the array. Finally, duplexers should be designed as small as possible to allow them to be easily integrated with the array.

Duplexers for ultrasound imaging systems can be designed to be active (i.e., controlled by a switching signal) or passive (i.e., functioning automatically).

Duplexers of this type generally consist of two subcircuits. The first subcircuit couples the transducer element to the transmitter in the transmit mode, and decouples the transducer element from the transmitter in the receive mode. In addition, this first subcircuit decouples the transmitter from the receiver in the receive mode. Conversely, the second subcircuit couples the transducer element to the receiver in the receive mode, and decouples the transducer element from the receiver in the transmit mode. In addition, this second subcircuit decouples the receiver from the transmitter in the transmit mode. The two subcircuits and the transducer element are electrically connected to one another at a common connection point.

An inverse-parallel circuit consisting of two p-n diodes arranged with opposing polarity and connected respectively between the transducer element and the transmitter can serve as a suitable first subcircuit of a duplexer. In the transmit mode, only the pulse height of the transmit pulses is then reduced by the comparably low conducting-state voltage of the diodes (typically 0.7 V). In the receive mode, the two diodes represent only a small capacitive load, since the voltages occurring in the received echo signals are generally considerably smaller than the conducting-state voltage of the diodes. A circuit of this type is disclosed in U.S. Pat. No. 5,271,403.

A duplexer for an ultrasound imaging system having a linear ultrasound array of transducer elements and two specially-designed subcircuits having the above-described functions is disclosed in German publication DE-A-33 01 967. In that device, the first subcircuit (i.e., the "transmitter switch") consists of a p-n diode as a first switch, which is connected between the transducer element and the transmitter, and a second switch, which is connected in parallel to the transducer element between a connection point (situated between the first switch and the transducer element) and ground to provide better reverse attenuation. In the second subcircuit (i.e., the "receiver switch"), a circuit consisting of a resistor, a bidirectional transient absorption Zener diode for protecting the receiver input, and a receiver amplifier is connected between a switch manufactured using CMOS technology (which is controllable with a TTL logic level and exhibits high reverse attenuation) and the transducer element. The receiver switch is connected to an input of the receiver.

A significant failing of known duplexers, such as the ones just described, is the existence of relatively high leakage capacitances toward ground and toward control lines. Moreover, increased loading of the transducer elements, exhibited as signal sources, is often associated with these leakage capacitances.

SUMMARY OF THE INVENTION

The present invention provides a duplexer for an ultrasound imaging system having the required functionality described above, but without the failings of prior art duplexers. According to the invention, the duplexer includes a first switch for electrically coupling transducer element to the receiver during receive mode, and for electrically decoupling both the transducer element and the transmitter from the receiver during transmit mode and a second switch for electrically coupling the ultrasound transducer element to a transmitter during transmit mode, and for electrically decoupling both the transducer element and the receiver from the transmitter during receive mode.

In this embodiment, both the first and second switches are connected to the transducer element at a common connection point. The first switch, used for electrically coupling the transducer element to the receiver during receive mode, includes a field-effect transistor whose source-drain path is connected between the transducer element and the receiver. Since neither the source nor the drain are connected to ground, leakage capacitances toward ground are largely avoided. Moreover, the field-effect transistor enables the electrical connection between the transducer element and the receiver to be switched with virtually no power loss. Such field-effect transistors can also be readily integrated with an array of transducer elements. Thus, a duplexer according to the present invention eliminates the principal drawbacks of prior art duplexers.

In an advantageous embodiment of the present invention, a gate of the field-effect transistor is electrically connected to a control voltage source preferably through a series resistor, enabling a control signal to be applied to the gate. Using an appropriately selected control signal, the field-effect transistor can readily be maintained in a blocking state while the imaging system is in the transmit mode, despite the presence of transmit pulses with steeply rising or falling pulse edges and their resulting transfer currents. When the imaging system is in the receive mode, an appropriate control signal can be used to bring the field-effect transistor into a conducting state for the incoming echo signals. Since no current flows through the series resistor, the switch for connecting the transducer element and the receiver in the receive mode operates virtually free from power loss.

In another advantageous embodiment of the present invention, a "normally-off" field-effect transistor is employed whose gate and source are electrically short-circuited together. A normally-off field-effect transistor is one whose source-drain resistance is high for a gate voltage $U_{GS}=0$ (i.e., closed channel) and low for a certain gate voltage $|U_{GS}|>0$ (i.e., open channel), with the sign of this voltage (i.e., its polarity) dependent on both the type of field-effect transistor (i.e., depletion or enhancement mode), as well as the conduction type of the channel (i.e., n- or p-channel). Short-circuiting the gate and source avoids any possible leakage capacitances of the gate toward ground. Another particular advantage of this embodiment is that the switch for connecting the transducer element and receiver in the receive mode is passively implemented; that is, no control signal is required for switching between the transmit and receive modes. In addition, the field-effect transistor carries the received echo signals from the transducer element to the receiver in a purely capacitive manner, so that little or no additional noise reaches the receiver.

Other features and advantages of the present invention will be apparent to persons skilled in the art from the following description of the preferred embodiments.

DETAILED DESCRIPTION

Figure 1:
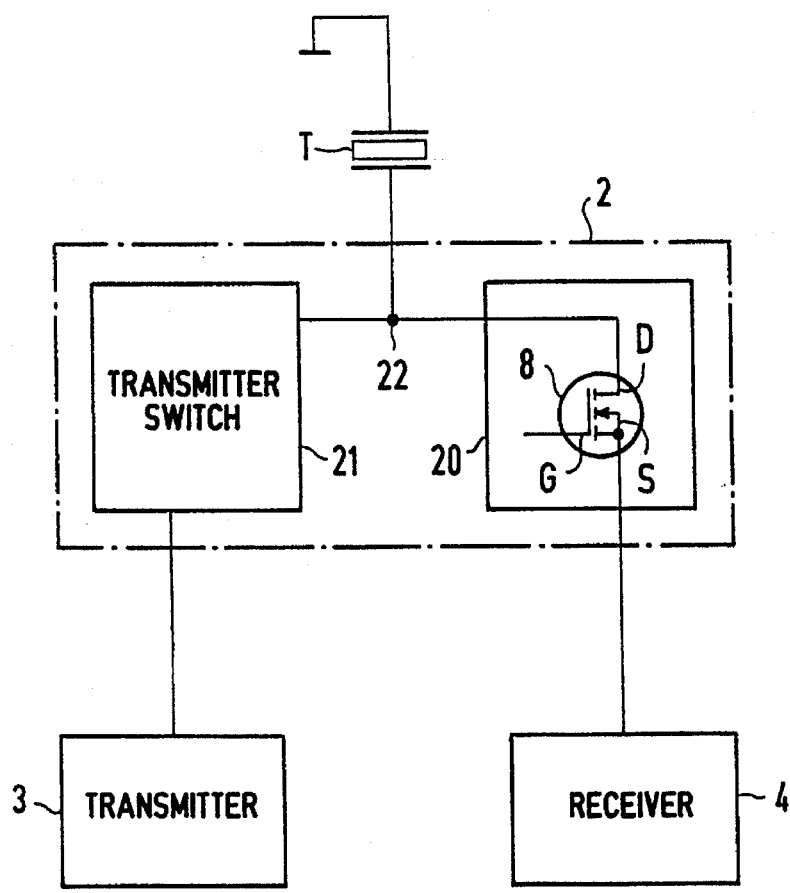
FIG. 1 shows an embodiment of an ultrasound imaging system including a duplexer with a field-effect transistor according to the present invention.

Referring now to FIG. 1, an ultrasound imaging system configured according to an embodiment of the present invention includes one or more ultrasound transducer elements T. The ultrasound imaging system is capable of selectively operating in two modes: transmit or receive. In the transmit mode, a transmitter 3 triggers the transducer element T with transmit pulses; while in the receive mode, a receiver 4 may be used to evaluate echo signals received by the transducer element T. A duplexer 2 facilitates switching between these two modes, electrically connecting the transducer element T to the transmitter 3 in the transmit mode, or to the receiver 4 in the receive mode.

Looking more closely at the transmit mode of operation, an object to be imaged (not shown) will be irradiated with ultrasonic pulses from the transducer element T. To accomplish this, the transmitter 3 emits transmit pulses sufficient to excite the transducer element T to ultrasound oscillation. The ON duration of a single transmit pulse can generally be selected to be between 50 ns and 500 ns, but is preferably about 150 ns; and the pulse height (i.e., amplitude) of the transmit pulses preferably is between 50 and 150 V.

Virtually any piezoelectric transducer element may be used in such an imaging system, although in the embodiment of FIG. 1 the transducer element T is preferably piezoceramic. Moreover, the transducer element T is ideally part of an ultrasound array (not shown) comprising a plurality of transducer elements. Such an array may be a linear array or a two-dimensional array, such as a matrix-type array. Arrays of this type are generally integrated in a substrate through microstructuring techniques known in the art.

In an embodiment of the present invention using a transducer array, a duplexer may be associated with each transducer element of the array, with the duplexer preferably integrated with the array in its substrate.

All transducer elements of the array may be driven by a single transmitter, using a phase lag, to generate a directed ultrasound beam that is preferably capable of being electronically directed at different parts of the object to be imaged. By contrast, in an embodiment with only a single transducer element, the object to be imaged may be mechanically scanned by physically moving the transducer element.

Looking now at the receive mode of the ultrasound imaging system of FIG. 1, ultrasound signals are reflected back from the object to the transducer element T (or an array of transducer elements T) as an echo pulse. The transducer element T converts these echo pulses into electrical signals (i.e., echo signals) that are then fed by the duplexer 2 to an input of the receiver 4. In the receiver 4, the input signals are preferably amplified and then fed to a signal processor (not shown) for evaluating the image information.

The duplexer 2 of this embodiment includes a receiver switch 20 for electrically connecting the transducer element T to the receiver 4 when the imaging system is operating in the receive mode. The receiver switch 20 is also used for electrically decoupling both the transducer element T and the transmitter 3 from the receiver 4 when the imaging system is operating in the transmit mode. The duplexer 2 further includes a transmitter switch 21 which, similar to the receiver switch 20, electrically connects the transducer element T to the transmitter 3 when the imaging system is in the transmit mode, and electrically decouples both the transducer element T and the receiver 4 from the transmitter 3 when the imaging system is in the receive mode. Both the receiver switch 20 and the transmitter switch 21 are electrically connected to the transducer element T through a common connection point 22.

In this embodiment, the receiver switch 20 includes a field-effect transistor 8 having a source S, a drain D and a gate G. The source S and the drain D are connected between the receiver 4 and the transducer element T. The resistance between the source S and the drain D is referred to as the "source-drain path" of the field-effect transistor 8.

An industry-standard, low-power MOSFET may be used as the field-effect transistor 8. Depending on the polarity of the transmit pulses and the conduction type (i.e., n-channel or p-channel) of the field-effect transistor 8, either (a) the source S can be coupled to an input of the receiver 4, and the drain D to the transducer element T (as shown in FIG. 1); or (b) the drain D can be coupled to the receiver 4, and the source S to the transducer element T (not shown). It is of course possible to connect additional circuit elements between the field-effect transistor 8 and the receiver 4 to meet the specific requirements of any particular application.

Figure 2:
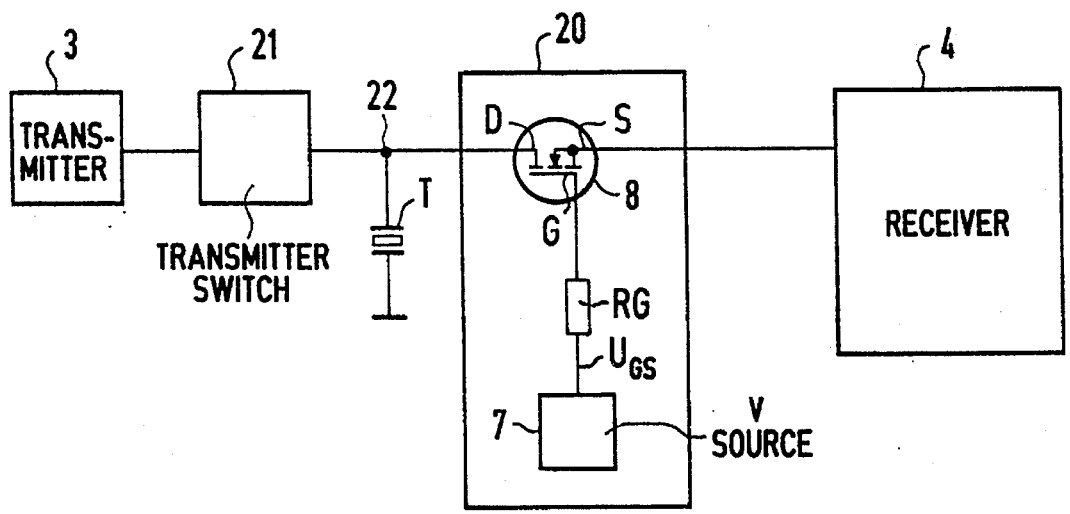
FIG. 2 is an embodiment of a duplexer with an actively controlled field-effect transistor.
Figure 3:
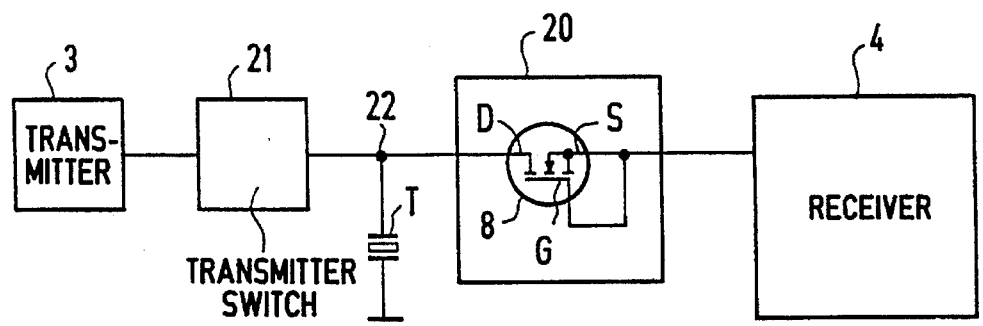
FIG. 3 is an embodiment of a duplexer with a passively controlled field-effect transistor.

In alternate embodiments of the present invention, the gate G of the field-effect transistor 8 may be connected through a series resistor to a control voltage source (as shown in FIG. 2) or short-circuited to the source S (as shown in FIG. 3). Referring to the embodiment of FIG. 2, the gate G of the field-effect transistor 8 is connected to a voltage source 7 through a series resistor RG. When the imaging system is in the transmit mode, the voltage source 7 supplies the gate G with a control voltage $U_{GS}$ sufficient to cause the field-effect transistor 8 to cut-off with respect to transmit pulses emitted by the transmitter 3. The control voltage $U_{GS}$ is preferably set such that the field-effect transistor 8 will not reach its conducting state even when exposed to transmit pulses with steeply rising edges, due to the capacitance $C_{GD}$ between the gate G and the drain D.

In the particular embodiment of FIG. 2, which employs a normally-off n-channel enhancement MOSFET as the field-effect transistor 8, the control voltage $U_{GS}$ is set such that the gate potential is negative with respect to the source potential. A typical value for the control voltage $U_{GS}$ is −10 V. If a normally-on field-effect transistor is used, the control voltage must be adapted accordingly. A sufficiently negative gate potential with respect to the source potential ensures that the gate G does not become positively charged with respect to the source S through the capacitance $C_{DG}$ between the drain D and the gate G, even upon the occurrence of steeply-rising transmit pulse edges. This objective can be ensured for the normally-occurring transmit pulse edges simply by choosing a gate-source capacitance $C_{GS}$ that is significantly larger than the drain-gate capacitance $C_{DG}$. Alternatively, the capacitance $C_{GS}$ between the gate G and the source S can be further increased by an additional capacitance (not shown) connected in parallel to the capacitance $C_{GS}$ to maintain the field-effect transistor 8 in its cut-off state during transmit mode, even for extremely steeply-rising transmit pulses edges.

In the receive mode, the voltage source 7 supplies a control voltage $U_{GS}$ on the gate G of the field-effect transistor 8 to bring the field-effect transistor 8 into its conducting (i.e., switched-on) state, thereby making the field-effect transistor 8 permeable to the echo signals from the transducer element T. In the embodiment shown in FIG. 2, the gate potential is set positive for this purpose (e.g., about +5 to +10 V higher than the source potential).

The series resistor RG of the embodiment shown in FIG. 2 is preferably chosen to have high-resistance (e.g., between 20 and 200 kΩ) to shield the transducer element T from the influence of the capacitances $C_{DG}$ and $C_{GS}$ between the drain D and the gate G, or between the gate G and the source S. Since practically no current flows through it, the series resistor RG experiences no power loss.

FIG. 3 illustrates yet another embodiment of the receiver switch 20. Here, the gate G of the field-effect transistor 8 is directly coupled to its source S (i.e., short-circuited). The field-effect transistor 8 is normally-off, and thus is switched off as a result of the short-circuiting of the source S and the gate G insofar as the source-drain resistance is concerned. This source-drain resistance is very high, typically on the order of several GΩ.

This embodiment advantageously exploits the dependence of the capacitance $C_{DS}$ between the drain D and the source S on the voltage $U_{DS}$ between the drain D and the source S (which voltage is also present between the gate G and the source S). This capacitance $C_{DS}$ is many times greater (typically, 20 to 30 times) when the drain D and the source S are at the same potential; that is, when the voltage $U_{DS}$ equals 0 V, as opposed to when a transmit pulse is applied to the source-drain path having a voltage $U_{DS}$ of, for example, 150 V. Thus, when the imaging system is in the transmit mode, only negligible transfer currents can pass through the field-effect transistor 8 because of the comparatively small capacitance $C_{DS}$. On the other hand, when the imaging system is in the receive mode, the field-effect transistor 8 functions as a coupling capacitance due to its much higher capacitance $C_{DS}$, allowing the echo signals from the transducer element T to be carried in a purely capacitive manner, with only minimal loss. As a result, virtually no additional noise is injected into the receiver 4. The field-effect transistor 8 thus functions in this specific embodiment like a high-voltage stable capacitance diode which operates in a purely passive manner.

In addition to the above characteristics, a field-effect transistor 8 according to the present invention preferably exhibits an impedance $Z_{SD}$ between the source S and the drain D in the switched-on state that is relatively small, and preferably significantly smaller, compared to the input impedance of the receiver 4. In this way, the attenuation of the echo signals from the transducer element T is kept advantageously low. In an especially advantageous enhancement, applicable to the switched-off (i.e., cut-off) state of the field-effect transistor 8 during transmit mode, the impedance $Z_{SD}$ between the source S and the drain D may be set greater than the impedance of the transducer element T to reduce power losses that otherwise might occur.

In a two-dimensional array of transducer elements T, their impedance is generally composed of a parallel circuit arrangement of about 5 kΩ and about 2 pF. A suitable impedance $Z_{SD}$ between the source S and the drain D of the field-effect transistor 8 may then be obtained, for example, by selecting a field-effect transistor 8 having an ohmic resistance between the source S and the drain D of between about 5 Ω and about 50 Ω (preferably about 12 Ω) in the switched-on state, a high-resistance (on the order of several GΩ) in the switched-off state, and correspondingly large capacitances between, respectively, two of the electrodes gate G, source S and drain D. Suitable values for these capacitances are: 3.5 pF for the capacitance $C_{DS}$ between the source S and the drain D for $U_{DS}$ equal to 25 V, or 80 pF for $U_{DS}$ equal to 0 V; 2.5 pF for the capacitance $C_{DG}$ between the drain D and the gate G; and 17.5 pF for the capacitance $C_{GS}$ between the gate G and the source S for a controllable field-effect transistor 8.

Figure 4:
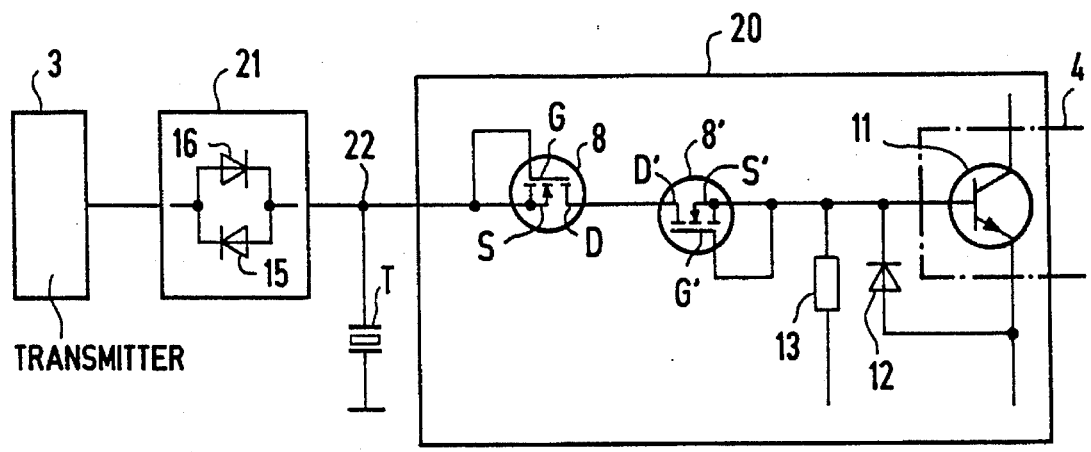
FIG. 4 is an embodiment of a duplexer with two field-effect transistors for shielding from bipolar transmit pulses.

Referring now to FIG. 4, another embodiment of a duplexer is shown in which a second field-effect transistor 8' is provided in addition to the first field-effect transistor 8. The drains D and D' of the two field-effect transistors 8 and 8' are electrically coupled. In addition, the source S of the first field-effect transistor 8 is coupled to the transducer element T, and the source S' of the second field-effect transistor 8' is coupled to the receiver 4. This arrangement offers the advantage of effectively shielding the receiver 4 from bipolar transmit pulses having both positive and negative components. With transistors other than the type shown in FIG. 4, it may be necessary to wire the two field-effect transistors 8 and 8' in reverse; that is, to connect the source S to the source S', and the drains D and D' to the transducer element T and the receiver 4, respectively. Persons skilled in the art will recognize that the illustrated embodiment for the receiver switch 20 may likewise be adapted to the controllable embodiment illustrated in FIG. 2.

The embodiment illustrated in FIG. 4 also includes a bipolar transistor 11 preferrably, serving as a preamplifier for the receiver 4. An additional diode 12 is associated with the transistor 11, connected in inverse-parallel to a diode formed by the base and the emitter of the transistor 11, thereby protecting the transistor 11 from residual currents that may pass through the field-effect transistors 8, 8' during transmit mode due to their residual capacitances between the transducer element T and the receiver 4. When the ultrasound imaging system is in the receive mode, the diode 12 represents a largely negligible capacitive load because it is slightly biased in its reverse direction as a result of the specified wiring, thereby reducing the capacitance of its depletion layer.

The receiver switch 20 of this embodiment further includes a resistor 13 connected in parallel to the diode 12 for establishing the potential at the connections of the source S of the field-effect transistor 8 and the base potential of the bipolar transistor 11. A protective circuit of this type (that is, having a diode associated with a preamplifier) may be provided in any of the embodiments discussed herein.

Finally, FIG. 4 illustrates a preferred embodiment of the transmitter switch 21. The transmitter switch 21 comprises an inverse-parallel circuit of two diodes 15, 16, having opposite polarities, connected between the transmitter 3 and the transducer element T through the common connection 22. Alternatively, instead of one or both of these diodes 15, 16, a series circuit arrangement of at least two diodes may be employed, with the diodes again disposed in an inverse-parallel manner. In either case, the diodes 15, 16 reduce the capacitive loading of the transducer element T.

In addition to the illustrated embodiment, the transmitter switch 21 may comprise an active (i.e., controllable) integrated circuit including CMOS switches. Such integrated circuits are known in the art and are disclosed, for example, in Tietze and Schenk, *Semiconductor Circuit Engineering* 217 (9th ed., Springer-Verlag 1990). In principle, the specific embodiment described herein for the transmitter switch 21, as well as any other suitable embodiments for such a switch, may be used in any of the described embodiments for a duplexer according to the present invention.

While the present invention has been described with reference to specific embodiments, persons skilled in the art will recognize that many modifications and variations are possible. Accordingly, the present invention embraces all alternatives, modifications and variations that fall within the spirit and scope of the appended claims, as well as all equivalents thereof.

What is claimed:

1. An ultrasound imaging system including at least one transducer element, a transmitter for exciting the transducer element with transmit pulses during a transmit mode, a receiver for evaluating echo signals received by the transducer element during a receive mode, and a duplexer for each transducer element, said duplexer comprising:

a first switch adapted to electrically couple the transducer element to the receiver during the receive mode, and to electrically decouple both the transducer element and the transmitter from the receiver during the transmit mode, said first switch comprising a field-effect transistor having a source-drain path connected between the transducer element and the receiver; and a second switch adapted to electrically couple the transducer element to the transmitter during the transmit mode, and to electrically decouple both the transducer element and the receiver from the transmitter during the receive mode;

wherein said first and second switches are electrically coupled to one another at a common connection point, and wherein said field-effect transistor is a normally-off field-effect transistor including a gate and a source that are short-circuited.

2. The ultrasound imaging system of claim 1, wherein said first switch further comprises:

a bipolar transistor having a base and an emitter, with said base being electrically coupled to said source or to said drain of said field-effect transistor; and a diode connected in an inverse-parallel manner to a diode formed by said base and said emitter.

3. The ultrasound imaging system of claim 2, wherein said bipolar transistor is included in a preamplifier of the receiver.

4. The ultrasound imaging system of claim 1, wherein said first switch further comprises a second field-effect transistor coupled in series to said first field-effect transistor in a drain-to-drain or a source-to-source manner.

5. The ultrasound imaging system of claim 4, wherein at least one of said first and second field-effect transistors exhibits a source-drain impedance that is smaller than an input impedance of the receiver when said at least one field-effect transistor is in a switched-on state.

6. The ultrasound imaging system of claim 5, wherein at least one of said first and second field-effect transistors exhibits a source-drain impedance that is greater than an input impedance of the transducer element.

7. The ultrasound imaging system of claim 1, wherein the ultrasound imaging system includes an ultrasound array of transducer elements.

* * * * *